United States Patent
Palusa

(10) Patent No.: US 6,842,032 B2
(45) Date of Patent: Jan. 11, 2005

(54) IDDQ TEST METHODOLOGY BASED ON THE SENSITIVITY OF FAULT CURRENT TO POWER SUPPLY VARIATIONS

(75) Inventor: Chaitanya Palusa, Santa Clara, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/684,119

(22) Filed: Oct. 10, 2003

(65) Prior Publication Data

US 2004/0080331 A1 Apr. 29, 2004

Related U.S. Application Data

(62) Division of application No. 09/862,045, filed on May 21, 2001, now Pat. No. 6,664,801.

(51) Int. Cl.⁷ ............................................. G01R 31/26
(52) U.S. Cl. ........................................ 324/765; 324/763
(58) Field of Search ................................ 324/763, 765, 324/73.1, 158.1; 714/718, 733; 702/57; 438/14–18

(56) References Cited

U.S. PATENT DOCUMENTS 5,731,700 A * 3/1998 McDonald ............... 324/158.1
6,118,293 A * 9/2000 Manhaeve et al. .......... 324/765

* cited by examiner

Primary Examiner—Vinh P. Nguyen
(74) Attorney, Agent, or Firm—Akin Gump Strauss Hauer & Feld, LLP

(57) ABSTRACT

A method for testing integrated circuits is provided. The method includes providing an excitation voltage to a device, such as a MOSFET. A power supply voltage is also provided to the device, such as a drain to source voltage or VCC. The quiescent power supply current of the device is then measured, such as the IDDQ of the MOSFET. The power supply voltage to the device is then varied, and it is determined whether a change in the IDDQ of the device exceeds a predetermined allowable change.

10 Claims, 5 Drawing Sheets

IDDQ TEST METHODOLOGY BASED ON THE SENSITIVITY OF FAULT CURRENT TO POWER SUPPLY VARIATIONS

This application is a divisional application of Ser. No. 09/862,045, "IDDQ Test Methodology Based On the Sensitivity of Fault Current To Power Supply Variations," filed May 21, 2001, now U.S. Pat. No. 6,664,801, to which priority for the present application is claimed and which is hereby incorporated by reference for all purposes.

FIELD OF THE INVENTION

The present invention relates generally to semiconductor devices, and more particularly, it relates to testing of MOSFETs.

BACKGROUND OF THE INVENTION

Drain current testing of field effect transistors (FETs) is known in the art. Such drain current testing (or IDDQ testing) is performed by applying a power supply or drain-to-source voltage to a FET device. An excitation voltage is then imposed across the device from an input, such as the gate, to an output, and it is determined whether the quiescent or long-term drain-to-source current from the power source changes over time. If a defect exists, then the drain-to-source current will increase when the defect breakdown occurs.

Although such IDDQ testing can detect certain defects, other defects might not be detected in a commercially practical period of time by such testing. Thus, devices can pass IDDQ testing and can still fail in service due to defects. When failures occur in service, retrofitting or replacement of systems and components may be required. The cost of such retrofitting may greatly exceed the original price of the component.

SUMMARY OF THE INVENTION

In accordance with the present invention, an apparatus and method for performing IDDQ testing of devices are provided that overcome known problems with performing IDDQ testing of devices.

In particular, an apparatus and method for performing IDDQ testing of devices are provided that allow faults and defects to be detected that might otherwise remain in devices that pass existing IDDQ tests.

In accordance with an exemplary embodiment of the present invention, a method for testing integrated circuits is provided. The method includes providing an excitation voltage to a device, such as a MOSFET. A power supply voltage is also provided to the device, such as a drain to source voltage or VCC. The quiescent power supply current of the device is then measured, such as the IDDQ of the MOSFET. The power supply voltage to the device is then varied, and it is determined whether a change in the IDDQ of the device exceeds a predetermined allowable change.

The present invention provides many important technical advantages. One important technical advantage of the present invention is an apparatus and method for testing devices that uses changes in quiescent power supply current to detect devices with potential defects or flaws. The present invention is particularly adapted for use with IDDQ testing of MOSFET circuits, where changes in IDDQ should not occur with changes in VCC unless there is a defect or flaw in the device.

The present invention utilizes the fact that quiescent current doesn't change with VCC to address the inherent inability to choose a single go/no-go value and still account for all the IDDQ variations from lot-to-lot, wafer-to-wafer, or other sources of variation. Likewise, testing schemes that utilize multiple IDDQ measurement points with different values of VCC yield incorrect results because quiescent current does not change with VCC even for non-defective chips. This can be established by considering that IDDQ has two components: 1) parasitic diode leakage and 2) sub-threshold conduction. Parasitic diodes in the devices of an integrated circuit are either at zero-bias or reverse-biased at VCC. In either case, this component of IDDQ doesn't change with VCC. The other component of IDDQ, the sub-threshold conduction current, has been observed and proven to independent of VCC, such as by the following equation and proof:

$$Id = W/L * Ido * \exp[-Vbs(1/nVt) - (1/Vt)] * [1 - \exp(-Vds/Vt)] * \exp[(Vgs - Vth)/(nVt)]$$

where p0 Id=drain current p0 Vt=thermal voltage (KT/q) p0 Vth=threshold voltage p0 Vds=drain-to-source voltage>>Vt (Vt=kT/q~25 mv, Vds~VCC) p0 Vbs=bulk-to-source voltage=0 (bulk potential=source potential) p0 Vgs=gate-to-source voltage p0 Ido=constant p0 W=width of MOS transistor p0 L=length of MOS transistor For the sub-threshold conduction for transistors that are turned off, every node is either at VCC or GND. Therefore, if: p0 Vds=0, there is no conduction at all. So, we can choose the values of p0 Vds=VCC and Vgs=0 for anaylsis. As a result:

$$Id = \sim W/L * Ido * \exp[(Vgs - Vth)/(nVt)]$$
$$= \sim W/L * Ido * \exp[(-Vth)/(nVt)]$$

Therefore, Id is independent of VCC.

Those skilled in the art will further appreciate the advantages and superior features of the invention together with other important aspects thereof on reading the detailed description that follows in conjunction with the drawings.

BRIEF DESCRIPTION OF THE SEVERAL VIEWS OF THE DRAWINGS

A better understanding of the present invention can be obtained when the following detailed description of an exemplary embodiment is considered in conjunction with the following drawings, in which.

DETAILED DESCRIPTION OF THE INVENTION

Figure 1:
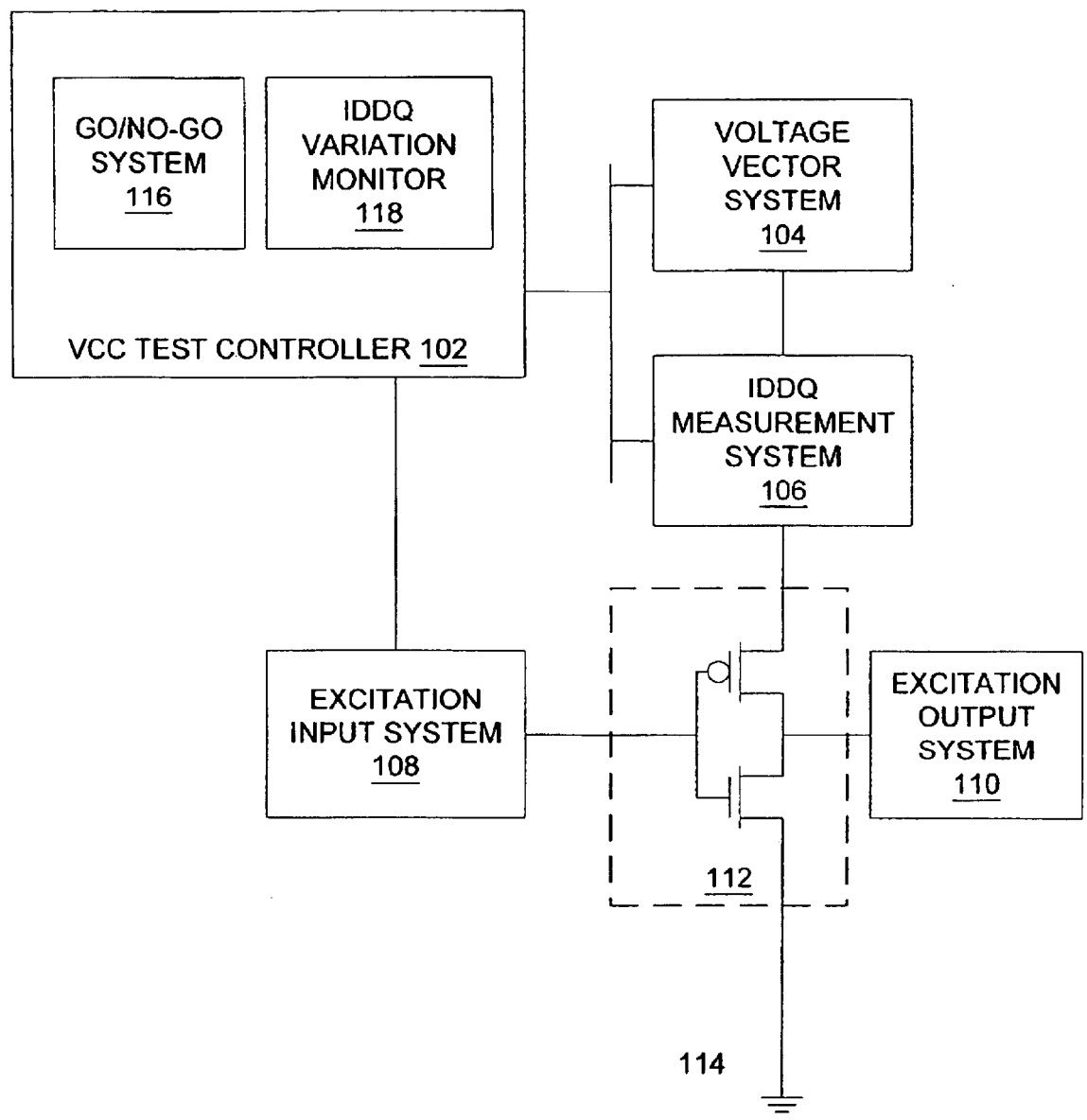
FIG. 1 is a diagram of a system for providing IDDQ variation testing in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1 is a diagram of a system 100 for providing IDDQ variation testing in accordance with an exemplary embodiment of the present invention. System 100 allows devices such as MOSFETs to be tested to detect defects that standard IDDQ testing might not detect.

System 100 includes VCC test controller 102, which can be implemented in hardware, software, or a suitable combination of hardware and software, and which can be one or more software systems operating on a suitable processor, such as a general purpose processing platform. VCC test controller 102 is coupled to voltage vector system 104 and IDDQ measurement system 106, each of which are coupled to device 112, which can be a MOSFET, an integrated circuit that includes a plurality of devices including two or more MOSFETs, or other suitable devices. Likewise, VCC testing controller 102 is coupled to excitation input system 108 and excitation output system 110, which are each coupled across the input and output of device 112, respectively. Device 112 is also coupled to ground 114, and voltage vector system 104, excitation input system 108 and excitation output system 110 can also be coupled to ground 114 or other suitable common voltage reference points.

Go/no-go system 116 and IDDQ variation monitor 118 can be implemented in hardware, software, or a suitable combination of hardware and software, and can be one or more software systems operating on a general purpose processing platform or other suitable processors. As used herein, a software system can include one or more objects, agents, threads, line of code, subroutines, separate software applications, two or more lines of code or other suitable software structures operating in two or more separate software applications, on two or more different processors, or other suitable software architectures. In one exemplary embodiment, a software system can include one or more lines of code or other suitable software structures operating in a general purpose software application, such as an operating system, and one or more lines of code or other suitable software structures operating in a specific purpose software application.

Go/no-go system 116 is coupled to IDDQ measurement system 106. As used herein, the term "couple", and its cognate terms such as "couples" and "coupled", can include a physical connection (such as through a copper conductor), a virtual connection (such as one or more randomly assigned memory locations of a data memory device), a logical connection (such as through one or more logical devices of a semiconducting circuit), a wireless connection, other suitable connections, or a suitable combination of such connections. In one exemplary embodiment, systems and components are coupled to other systems and components through intervening systems and components, such as through an operating system of a general purpose processing platform.

Go/no-go system 116 receives IDDQ current data from IDDQ measurement system 106 and determines whether the IDDQ current exceeds predetermined maximum allowable currents. In one exemplary embodiment, a maximum and minimum range for IDDQ can be determined empirically for device 112, such that if the measured value of IDDQ current is below the minimum, then the device can be presumed good and defect free from any significant defects. Likewise, the second or maximum IDDQ current can be set at a level such that the device can be said to be faulty if the measured value of IDDQ is greater than this level. Go/no-go system 116 can cause testing of device 112 to be stopped if the measured IDDQ is below the minimum acceptable voltage level, and can initiate testing through IDDQ variation monitor 118 if the voltage is between the minimum and maximum allowable voltages.

IDDQ variation monitor 118 receives voltage vector system 104 outputs and IDDQ measurement system 106 current, and determines whether the change in IDDQ current as a function of voltages applied by voltage vector system 104 indicates potential defects of device 112. In one exemplary embodiment, applying a power supply voltage and excitation vector to device 112 can generate an IDDQ current that includes two basic components. The first component is parasitic diode leakage which is the reverse bias current at the source/drain junctions. All junctions can be biased at either 0.0 volts or VCC, such that the current through IDDQ measurement system 106 remains the same regardless of variations in VCC.

The second current component is a subthreshold conduction component. This is the source-to-drain current when transistors are supposed to be shut off. Subthreshold conduction current does not change with changes in VCC. IDDQ variation monitor 118 generates notification data if variations in IDDQ current measurements as a function of different voltages applied by voltage vector system 104 exceed predetermined allowable variations, such that potential defects are indicated.

In operation, system 100 is used to test devices such as MOSFET 112 to determine whether potential defects may exist. System 100 applies a power supply voltage through voltage vector system 104 to device 112. An excitation voltage is then applied to device 112 and a quiescent IDDQ measurement is obtained. The power supply voltage is then varied to determine whether any changes in the quiescent IDDQ current occur. If such changes exceed predetermined allowable variations, then device defects can be inferred. System 100 can be used in conjunction with existing IDDQ testing, which is based on a "go/no-go paradigm," where the device 112 is considered acceptable if the IDDQ current is below a predetermined value. System 100 modifies the "go/no-go paradigm" by adding one or more additional levels at which additional IDDQ variation testing is performed. In this manner, system 100 increases the reliability of IDDQ testing by detecting devices that would otherwise fail after they have been installed in systems or components.

Figure 2:
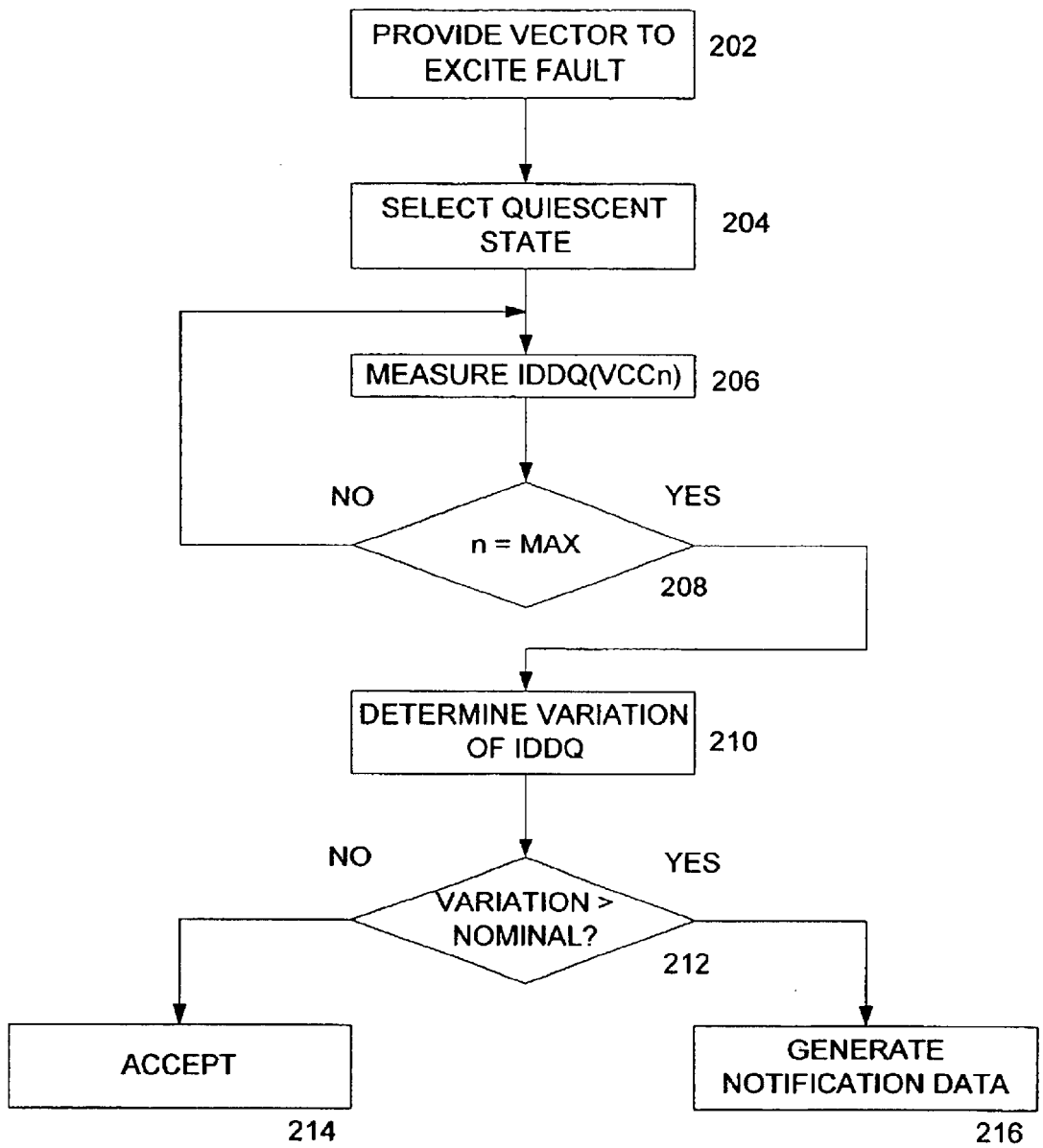
FIG. 2 is a flowchart of a method for performing IDDQ testing in accordance with an exemplary embodiment of the present invention.

FIG. 2 is a flowchart of a method 200 for performing IDDQ testing in accordance with an exemplary embodiment of the present invention. Method 200 allows defects and devices to be detected by varying the power supply voltage and determining if changes in IDDQ current or power supply current indicate potential defects.

Method 200 begins at 202 where a voltage vector is provided to excite a fault in a device. In one exemplary embodiment, the voltage vector can be applied to the input and output of a MOSFET device or other suitable devices. The device can also be supplied with a power supply voltage, such as a drain-to-source voltage or other suitable voltages. The method then proceeds to 204.

At 204, it is determined when a quiescence state has been reached. In one exemplary embodiment, the quiescence state can be reached after a predetermined period of time has passed after provision of the excitation vector. Likewise, other quiescence states can be selected. The method then proceeds to 206.

At 206, the IDDQ as a function of a supply voltage level is measured. In one exemplary embodiment, the supply voltage can be increased from a minimum to a maximum at a number of predetermined points. Other suitable supply voltage variations sequences can be used, such as from maximum to minimum, random, in accordance with predetermined sequences, based on previous IDDQ readings and supply voltage settings, or other suitable sequences. The method then proceeds to 208.

At 208, it is determined whether the number of readings taken equals the maximum number. In one exemplary embodiment, the maximum number can be predetermined, can be a function of the variation measured in previous steps, or other suitable procedures can be used. If the number of measurements if less than the maximum, then the method returns to 206. Otherwise, the method proceeds to 210.

At 210, the variation in the IDDQ is determined. In one exemplary embodiment, statistical analysis can be applied to the measurement points to determine mean variations, maximum variations, median variations, variation trends, or other suitable variations. The method then proceeds to 212.

At 212, it is determined whether the variation is greater than nominal. In one exemplary embodiment, nominal variations can be determined empirically by testing large numbers of devices, can be determined in accordance with calculated nominal variations for acceptable device variations, or other suitable nominal variations can be used. If it is determined at 212 that the variation is not greater than nominal, the method proceeds to 214 where the device is accepted. Otherwise, the method proceeds to 216 where notification data is generated. In one exemplary embodiment, the notification data can include a report entry for the device that can be scanned after completion of testing of all devices. Likewise, robotic control data can be generated to remove the device from testing or to mark the device as failed, an operator can be notified, or other suitable notification data can be generated.

In operation, method 200 allows devices to be tested to detect faults. The devices can include MOSFET devices where the IDDQ current is measured as a function of changes in supply voltage. If the variations in IDDQ are greater than predetermined nominal variations, then it can be inferred that a defect in the device may cause the device to fail.

Figure 3:
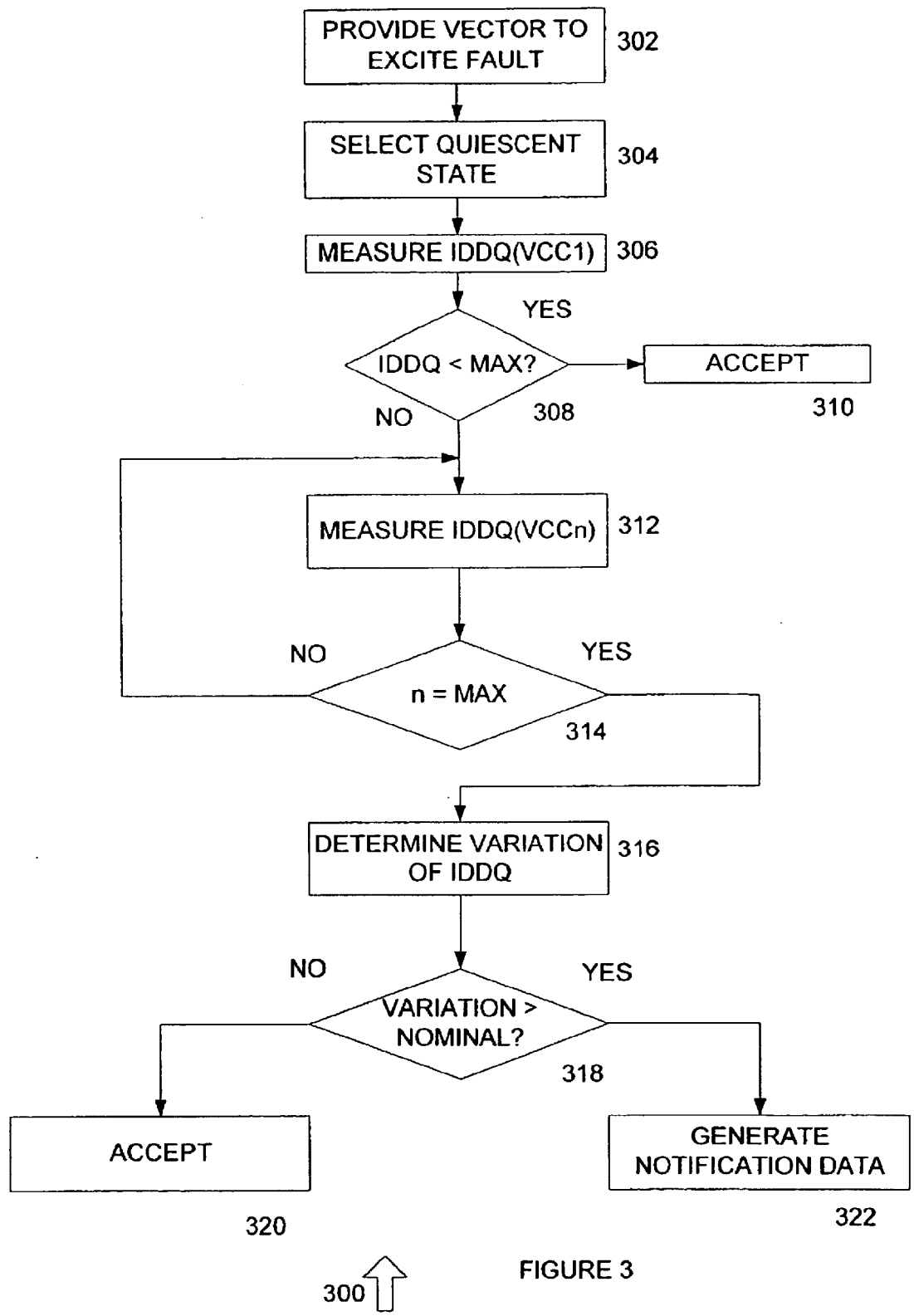
FIG. 3 is a flowchart of a method for performing two stages of IDDQ testing in accordance with an exemplary embodiment of the present invention.

FIG. 3 is a flowchart of a method 300 for performing two stages of IDDQ testing in accordance with an exemplary embodiment of the present invention. Method 300 allows multiple IDDQ acceptance levels to be set such that if IDDQ is below predetermined values then devices are accepted without performing additional IDDQ testing, such as where a large number of devices are being tested and it is desired to decrease the amount of time for testing each device.

Method 300 begins at 302 where a vector is applied to a device to excite a fault. The vector can be applied to an input and output of the device after the device has been subjected to a power supply voltage, or the device can be tested without power supply voltage. The method then proceeds to 304.

At 304, a quiescent state is selected for the device. The quiescent state can be determined by a predetermined period of time, by predetermined length of times and changes, or in accordance with other suitable procedures. The method then proceeds to 306.

At 306, an IDDQ is measured at a first measurement point. The first measurement point can be based on device operating power supply voltages, maximum test overvoltages, or other suitable voltages. The method then proceeds to 308.

At 308, it is determined whether the IDDQ measured is less than the maximum current. If the IDDQ is less than the maximum current, the method proceeds to 310 and the device is accepted. Otherwise, the method proceeds to 312.

At 312, IDDQ at a different power supply voltage level is measured. The voltage can be changed as a function of a predetermined sequence of increasing or decreasing steps, at random sequence, based on prior measurements, or other suitable selection criteria. The method then proceeds to 314 where it is determined whether all steps have been measured. If the number of steps does not equal the maximum number, the method returns to 312. Otherwise, the method proceeds to 316.

At 316, the variation in IDDQ is determined, such as by determining the maximum variation, the mean variation, the median variation, variation trends, or other suitable variations. The method then proceeds to 318.

At 318, it is determined whether the variation exceeds nominal values. If variations do not exceed nominal values, the method proceeds to 320 where the device is accepted. Otherwise, the method proceeds to 322 where notification data is generated.

In operation, method 300 allows devices to be tested in a two-stage process, where a first level is determined for power supply current. If the first level is not exceeded, then the device is accepted. Otherwise, a second level of testing is performed where variations of power supply current as a function of power supply voltage are determined. If these variations do not exceed nominal values for variations, then the device is accepted. Otherwise, the device is rejected.

Figure 4:
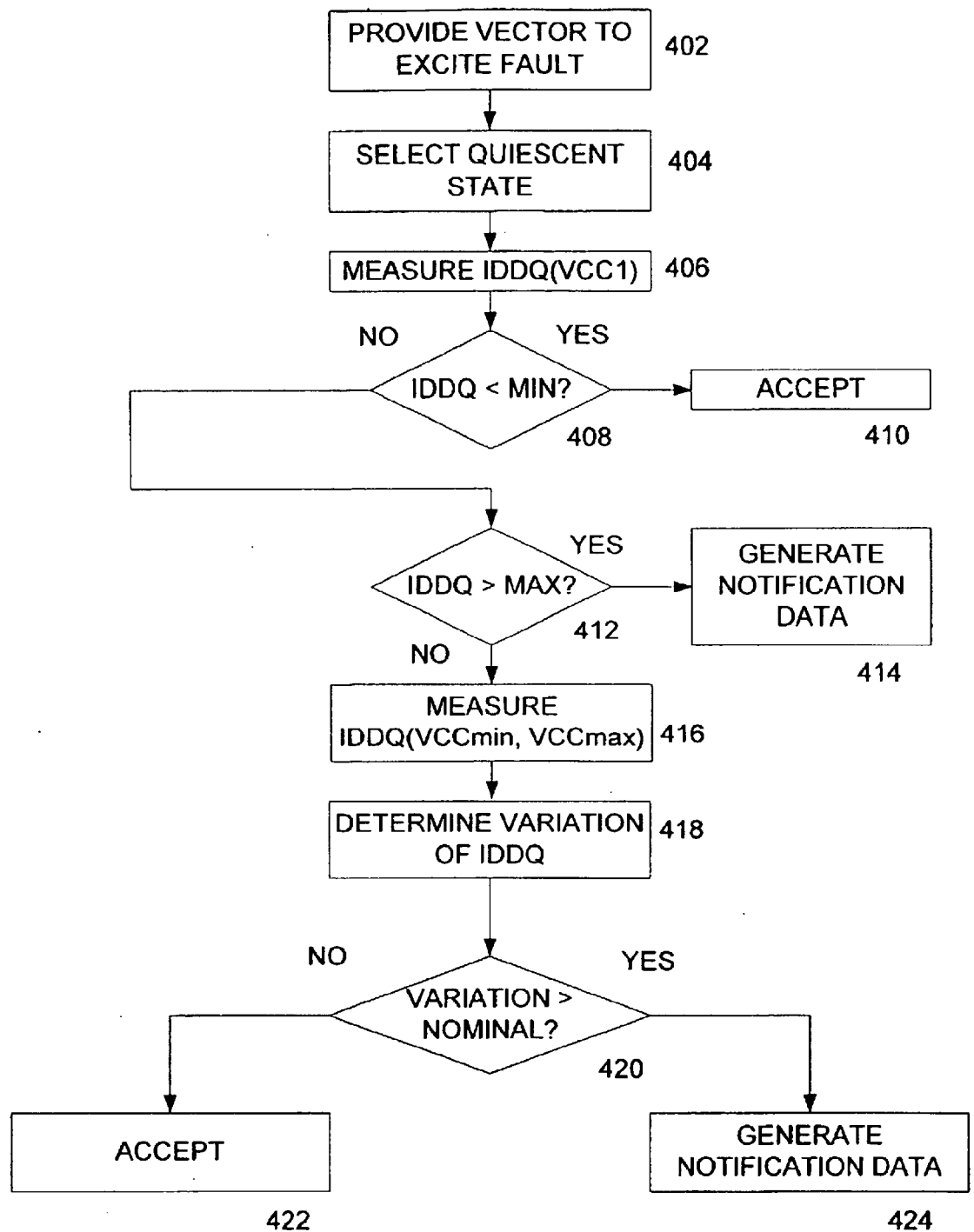
FIG. 4 is a flowchart of a method for performing two stages of IDDQ testing in accordance with an exemplary embodiment of the present invention.

FIG. 4 is a flowchart of a method 400 for performing IDDQ testing in accordance with an exemplary embodiment of the present invention. Method 400 allows IDDQ measurements at various voltages to be used to determine whether the device is acceptable.

Method 400 begins at 402 where a power supply voltage is applied to a device and an excitation vector is applied to excite a fault. The power supply voltage can vary from zero to in excess of operating levels, and the excitation fault vector can include one or more voltage levels that the device may be exposed to during operation up to a maximum design level. The method then proceeds to 404.

At 404, a quiescent state is selected. The quiescent state can include a predetermined period of time, predetermined changes, or other suitable quiescent states. The method then proceeds to 406.

At 406, IDDQ at a first voltage level is measured. The first voltage can be the operating voltage level, a design maximum level, or other suitable levels. The method then proceeds to 408. At 408, it is determined whether IDDQ is less than a minimum acceptable level. If the IDDQ is less than the minimum acceptable level, the method proceeds to 410 where the device is accepted. Otherwise, the method proceeds to 412.

At 412, it is determined whether IDDQ is greater than a maximum determined allowable level, such that a range of IDDQ is tested for. If the IDDQ is greater than the maximum level, the method proceeds to 414 where notification data is generated. In one exemplary embodiment, the notification data can include data that causes the device to be removed from testing, that notifies an operator, that causes a mark to be applied to the device, or other suitable notification data can be generated. The method then proceeds to 416.

At 416, the variation in IDDQ is determined, such as by determining the maximum variation, the mean variation, the median variation, variation trends, or other suitable variations. The method then proceeds to 418.

At 418, it is determined whether the variation exceeds nominal values. If variations do not exceed nominal values, the method proceeds to 420 where the device is accepted. Otherwise, the method proceeds to 422 where notification data is generated.

In operation, method 400 allows devices to be tested in a two-stage process, where a first level is determined for power supply current. If the first level is not exceeded, then the device is accepted. Otherwise, a second level of testing is performed where variations of power supply current as a function of power supply voltage are determined. If these variations do not exceed nominal values for variations, then the device is accepted. Otherwise, the device is rejected.

Figure 5:
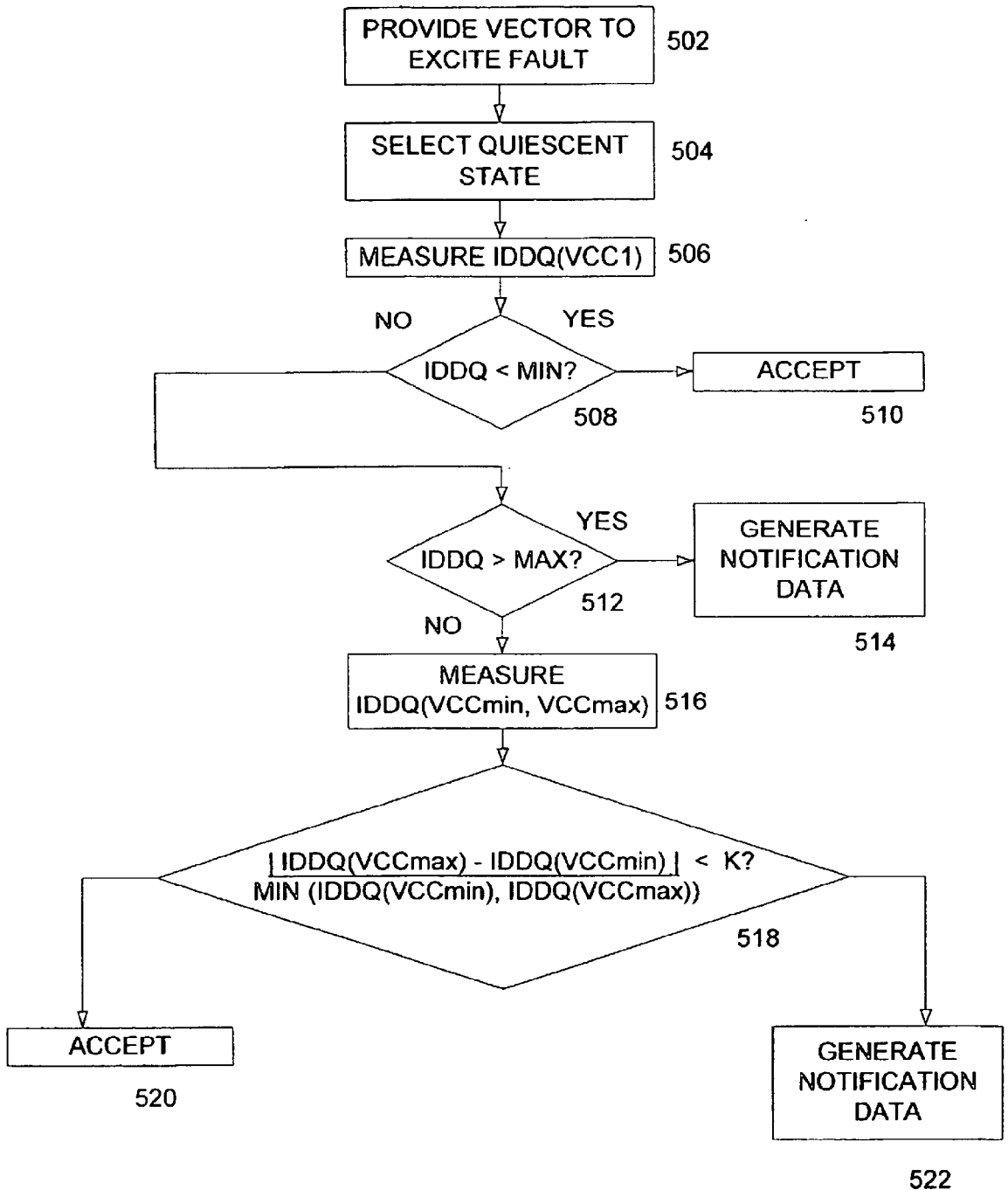
FIG. 5 is a flowchart of a method for performing IDDQ testing in accordance with an exemplary embodiment of the present invention.

FIG. 5 is a flowchart of a method 500 for performing IDDQ testing in accordance with an exemplary embodiment of the present invention. Method 500 is a special case of method 400 with measurement points only taken in the final stage.

Method 500 begins at 502 where a power supply voltage is applied to a device and an excitation vector is applied to excite a fault. The power supply voltage can vary from zero to in excess of operating levels, and the excitation fault vector can include one or more voltage levels that the device may be exposed to during operation up to a maximum design level. The method then proceeds to 504.

At 504, a quiescent state is selected. The quiescent state can include a predetermined period of time, predetermined changes, or other suitable quiescent states. The method then proceeds to 506.

At 506, IDDQ at a first voltage level is measured. The first voltage can be the operating voltage level, a design maximum level, or other suitable levels. The method then proceeds to 508. At 508, it is determined whether IDDQ is less than a minimum acceptable level. If the IDDQ is less than the minimum acceptable level, the method proceeds to 510 where the device is accepted. Otherwise, the method proceeds to 512.

At 512, it is determined whether IDDQ is greater than a maximum determined allowable level, such that a range of IDDQ is tested for. If the IDDQ is greater than the maximum level, the method proceeds to 514 where notification data is generated. In one exemplary embodiment, the notification data can include data that causes the device to be removed from testing, that notifies an operator, that causes a mark to be applied to the device, or other suitable notification data can be generated. The method then proceeds to 516.

At 516, the IDDQ at a power supply maximum and minimum is determined. In one exemplary embodiment, the maximum can be an operating voltage level or a design maximum, and the minimum can be zero, a negative voltage, or other suitable voltages. The method then proceeds to 518.

At 518, the absolute value of the difference between the IDDQ at the maximum and minimum levels is divided by the minimum of either of those two values and it is determined whether that value is less than a predetermined value. If the value is less than a predetermined value, which can be determined empirically, the method proceeds to 520 and the device is accepted. Otherwise, the method proceeds to 522 and notification data is generated.

In operation, method 500 provides an IDDQ testing procedure that allows devices with defects to be detected that would otherwise pass a go/no-go test. Method 500 identifies a range of acceptable IDDQ values and performs additional testing to detect devices with failure modes that would not be determined otherwise.

In view of the above detailed description of the present invention and associated drawings, other modifications and variations will now become apparent to those skilled in the art. It should also be apparent that such other modifications and variations may be effected without departing from the spirit and scope of the present invention.

I claim:

1. A method for testing integrated circuit device comprising:

providing an excitation voltage to a device;

providing a power supply voltage to the device;

measuring the quiescent power supply current of the device;

changing the power supply voltage to the device; and determining whether a change in quiescent power supply current of the device exceeds a predetermined allowable change.

2. The method of claim 1 wherein the device is a field effect transistor.

3. The method of claim 1 wherein changing the power supply voltage to the device comprises changing the power supply voltage to one or more predetermined voltages.

4. The method of claim 1 wherein determining whether the change in quiescent power supply current of the device exceeds the predetermined allowable change comprises determining whether $(|IDDQ(VCCmax)-IDDQ(VCCmin)|/(Min\ (IDDQ(VCCmax),\ IDDQ(VCCmin))))$ is less than a predetermined value.

5. The method of claim 1 wherein measuring the quiescent power supply current of the device comprises:

determining whether the quiescent power supply current exceeds a maximum predetermined value; and stopping subsequent testing if the quiescent power supply current exceeds the maximum predetermined value.

6. The method of claim 1 further comprising generating notification data if the change in quiescent power supply current of the device exceeds the predetermined allowable change.

7. A method for testing integrated circuit comprising:

providing an excitation voltage to a device;

providing a power supply voltage to the device;

measuring the quiescent power supply current of the device; and changing the power supply voltage to the device if the quiescent power supply current is less than a predetermined value.

8. The method of claim 7 further comprising stopping testing if the quiescent power supply current exceeds the predetermined value.

9. The method of claim 7 wherein measuring the quiescent power supply current of the device further comprises waiting a predetermined period of time before measuring the quiescent power supply current of the device.

10. The method of claim 7 wherein the device is a field effect transistor.

* * * * *